(12) United States Patent
Sawamura

(10) Patent No.: US 7,465,984 B2
(45) Date of Patent: Dec. 16, 2008

(54) NONVOLATILE MEMORY ELEMENT

(75) Inventor: Kenji Sawamura, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/772,417

(22) Filed: Jul. 2, 2007

(65) Prior Publication Data

US 2008/0121978 A1 May 29, 2008

(30) Foreign Application Priority Data

Jul. 6, 2006 (JP) .............................. 2006-187150

(51) Int. Cl.
*H01L 29/788* (2006.01)
(52) U.S. Cl. .................... 257/315; 257/324; 257/E29.3
(58) Field of Classification Search ................ 257/314, 257/315, 316, 317, 324, E29.129, E29.3
See application file for complete search history.

(56) References Cited

U.S. PATENT DOCUMENTS 7,368,780 B2 * 5/2008 Tanaka et al. ............... 257/315

| | | |
|---|---|---|
| 2005/0266638 A1 | 12/2005 | Cho et al. |
| 2006/0054957 A1 | 3/2006 | Ozawa et al. |
| 2006/0081916 A1 | 4/2006 | Sohn et al. |
| 2006/0094188 A1 | 5/2006 | Kim et al. |

FOREIGN PATENT DOCUMENTS

| | | |
|---|---|---|
| JP | 2005-217409 | 8/2005 |
| KR | 10-2005-0113887 | 12/2005 |

* cited by examiner

*Primary Examiner*—Hoai v Pham
(74) *Attorney, Agent, or Firm*—Oblon, Spivak, McClelland, Maier & Neustadt, P.C.

(57) ABSTRACT

A nonvolatile memory element includes a laminated gate provided above a semiconductor substrate with a tunnel insulating film disposed therebetween and having a floating gate electrode, a gate-gate insulating film and a control gate electrode sequentially stacked. The gate-gate insulating film includes a first silicon oxide film, a first aluminum oxide film having hafnium added thereto, a second aluminum oxide film, a third aluminum oxide film having hafnium added thereto and a second silicon oxide film sequentially stacked.

18 Claims, 5 Drawing Sheets

NONVOLATILE MEMORY ELEMENT

CROSS-REFERENCE TO RELATED APPLICATIONS

This application is based upon and claims the benefit of priority from prior Japanese Patent Application No. 2006-187150, filed Jul. 6, 2006, the entire contents of which are incorporated herein by reference.

BACKGROUND OF THE INVENTION

1. Field of the Invention

This invention relates to a nonvolatile memory element, for example, a nonvolatile memory element which has a gate-gate insulating film disposed between a floating gate electrode and a control gate electrode.

2. Description of the Related Art

As a semiconductor memory, an electrically erasable programmable read only memory (EEPROM) with respect to which data can be electrically written and erased is known. Further, as one example of the EEPROM, a NAND flash memory which can be formed with high integration density is known.

A memory cell transistor of the NAND flash memory has a laminated gate structure used for charge storage and has a floating gate electrode, gate-gate insulating film and control gate electrode stacked and formed above a semiconductor substrate, with a tunnel insulating film disposed therebetween.

For example, the gate-gate insulating film disposed between the floating gate electrode and the control gate electrode is formed of an oxide film and nitride film. With the above gate-gate insulating film, the effective oxide thickness (EOT) becomes large. The EOT can be reduced by using an oxide film and high-dielectric-constant film.

However, for example, when an aluminum oxide film ($AlO_x$ film) is used as a high-dielectric-constant film, there occurs a problem that a leak current flows due to the Poole-Frenkel effect at the time of application of a weak electric field. If a leak current occurs, charges stored in the floating gate electrode of the memory cell transistor are discharged via the gate-gate insulating film. If charges are discharged from the floating gate electrode, the threshold voltage of the memory cell transistor, expressed by the relational expression of "$\Delta Vt = \int Qdt/Ccg\text{-}fg$", varies with time. There therefore occurs a problem that data written in the memory cell transistor cannot be held, which, as stated above, is due to a variation in the threshold voltage. In this case, V indicates the threshold voltage of the memory cell transistor, Q indicates the charge in the floating gate electrode, Ccg-fg indicates the capacitance between the control gate electrode and the floating gate electrode, and t indicates time.

As a related technique, a multilayered dielectric structure of a semiconductor device, in which the interface characteristic is improved and the EOT is reduced, is disclosed (refer to Jpn. Pat. Appln. KOKAI Publication No. 2005-217409).

BRIEF SUMMARY OF THE INVENTION

According to a first aspect of the present invention, there is provided a nonvolatile memory element comprising a laminated gate provided above a semiconductor substrate with a tunnel insulating film disposed therebetween and having a floating gate electrode, a gate-gate insulating film and a control gate electrode sequentially stacked. The gate-gate insulating film includes a first silicon oxide film, a first aluminum oxide film having hafnium added thereto, a second aluminum oxide film, a third aluminum oxide film having hafnium added thereto and a second silicon oxide film sequentially stacked.

According to a second aspect of the present invention, there is provided a nonvolatile memory element comprising a laminated gate provided above a semiconductor substrate with a tunnel insulating film disposed therebetween and having a floating gate electrode, a gate-gate insulating film and a control gate electrode sequentially stacked. The gate-gate insulating film includes a first silicon nitride film, a first aluminum oxide film having hafnium added thereto, a second aluminum oxide film, a third aluminum oxide film having hafnium added thereto and a second silicon nitride film sequentially stacked.

DETAILED DESCRIPTION OF THE INVENTION

There will now be described embodiments of this invention with reference to the accompanying drawings. In the following explanation, elements having the same functions and same configurations are denoted by the same reference symbols and the repetitive explanation thereof is made only when required.

First Embodiment

Figure 1:
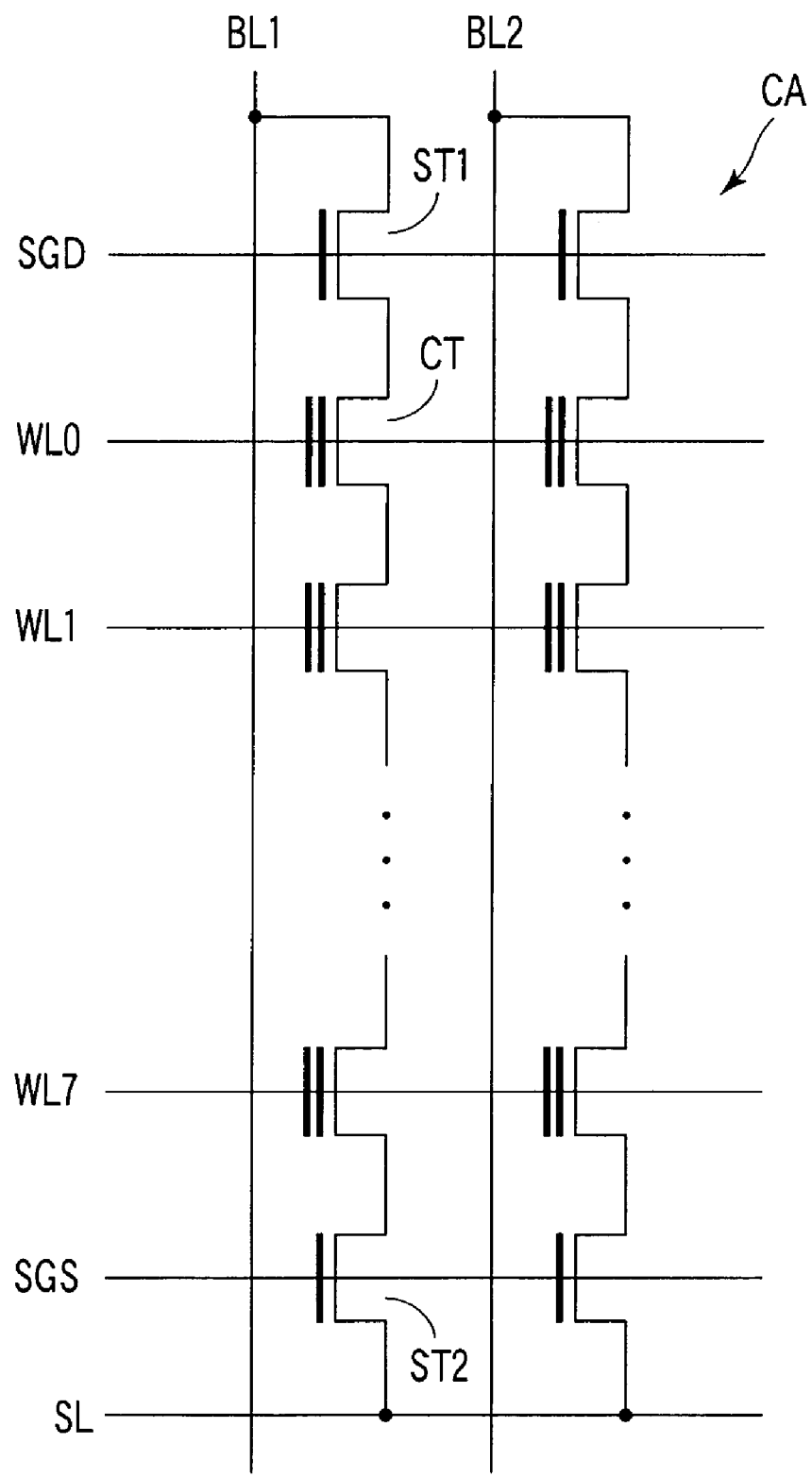
FIG. 1 is a circuit diagram illustrating a NAND flash memory according to a first embodiment of this invention.

FIG. 1 is a circuit diagram illustrating a NAND flash memory according to a first embodiment of this invention. Each unit includes a memory cell string having a plurality of memory cell transistors CT (typically, eight memory cell transistors CT) serially connected, and a pair of selection gate transistors ST1, ST2. The selection gate transistor ST1 is serially connected to one end (drain-side end) of the memory cell string. The selection gate transistor ST2 is serially connected to the other end (source-side end) of the memory cell string.

The control gate terminals of the memory cell transistors CT are respectively connected to corresponding word lines WL extending in the row direction. The gate terminals of the selection gate transistors ST1 are connected to a selection gate line SGD extending in the row direction. The drain terminals of the selection gate transistors ST1 are respectively connected to bit lines BL extending in the column direction. The gate terminals of the selection gate transistors ST2 are connected to a selection gate line SGS extending in the row direction. The source terminals of the selection gate transistors ST2 are commonly connected to a source line SL extending in the row direction.

The selection gate lines SGD, SGS are provided to control the ON/OFF states of the selection gate transistors ST1, ST2. The selection gate transistors ST1, ST2 function as gates to supply preset potentials to the memory cell transistors CT in the unit at the data write time, data read time or the like. A plurality of units are arranged in a matrix form to configure a memory cell array CA.

Figure 2:
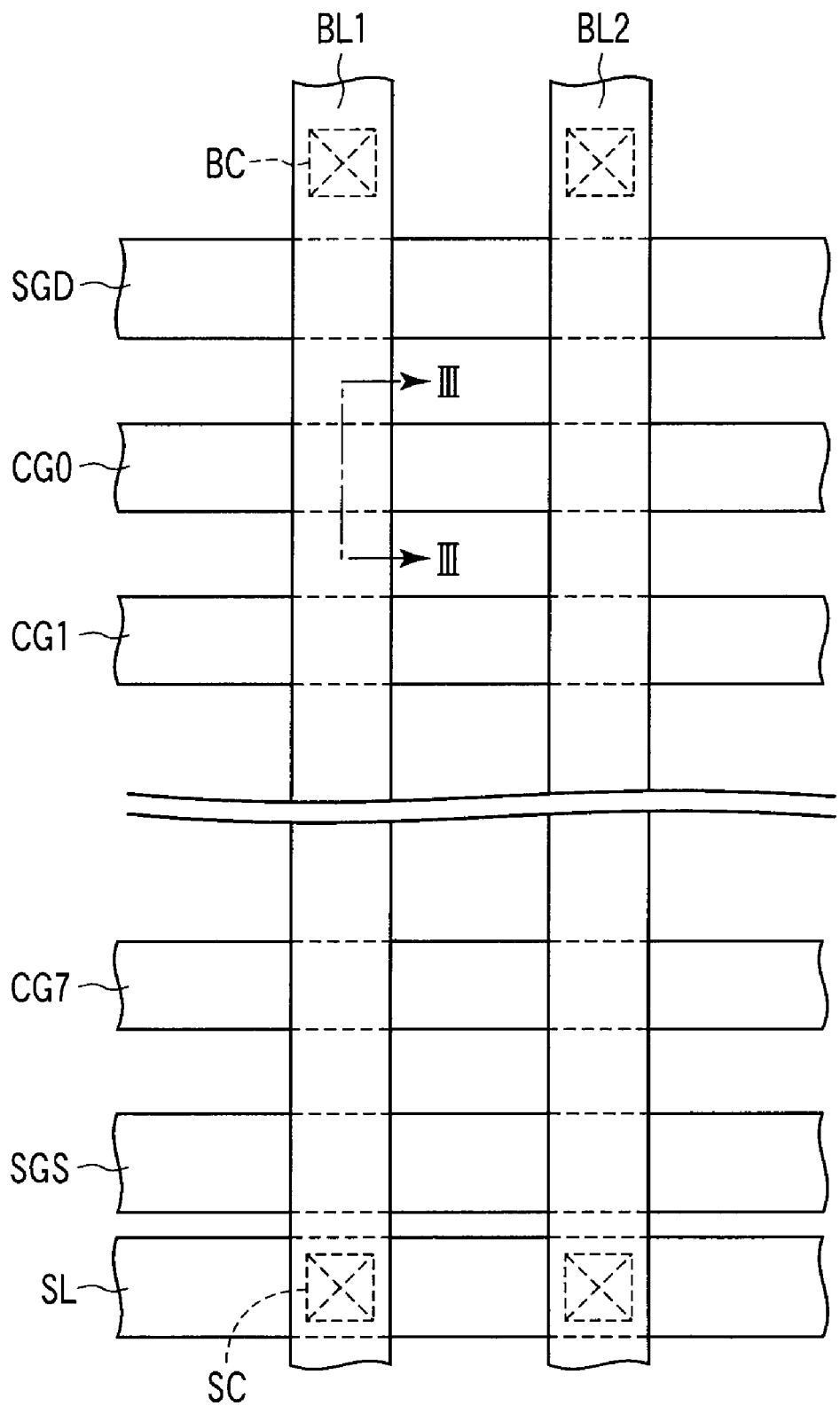
FIG. 2 is a plan view illustrating the NAND flash memory.

FIG. 2 is a plan view of the NAND flash memory. The memory cell transistors CT are provided in intersecting areas between the control gate electrodes CG and the bit lines BL. The control gate electrodes CG correspond to the word lines WL shown in FIG. 1.

The selection gate transistors ST1 are provided in intersecting areas between the selection gate line SGD and the bit lines BL. The selection gate transistors ST2 are provided in intersecting areas between the selection gate line SGS and the bit lines BL. The drain regions of the selection gate transistors ST1 are connected to the respective bit lines BL via bit line contacts BC. The source regions of the selection gate transistors ST2 are connected to the source line SL via source line contacts SC.

Figure 3:
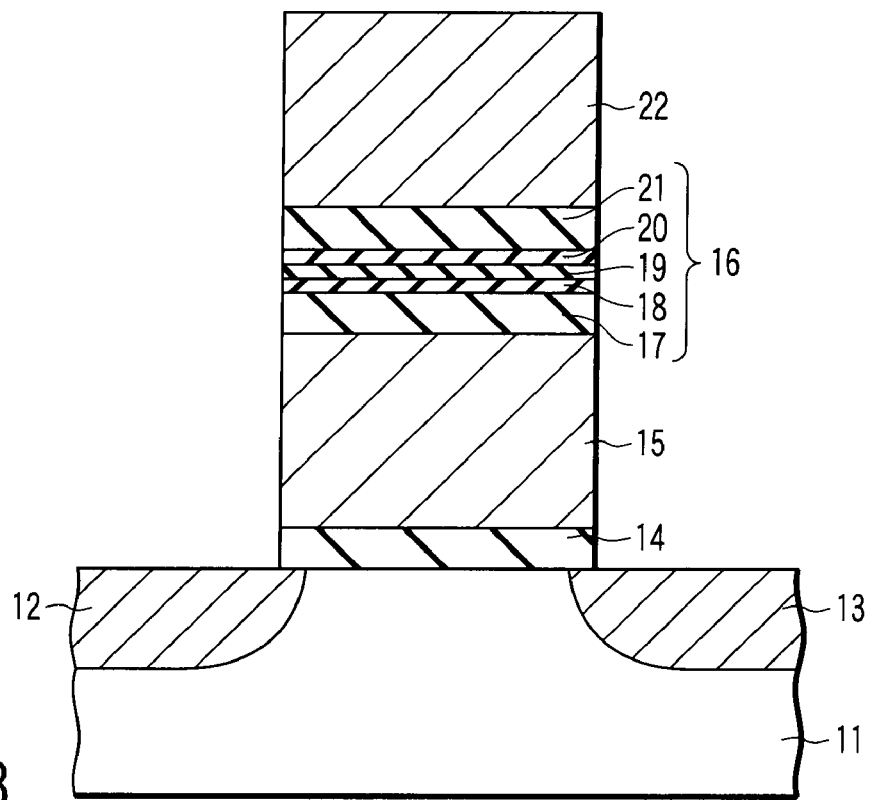
FIG. 3 is a cross sectional view illustrating a memory cell transistor CT according to the first embodiment.

FIG. 3 is a cross sectional view taken along the III-III line of FIG. 2, for illustrating the memory cell transistor CT functioning as a nonvolatile memory element. In FIG. 3, the bit line BL, and an inter-level insulating layer formed between the memory cell transistor CT and the bit line are omitted.

A substrate 11 of P-type conductivity is formed of a P-type semiconductor substrate, a semiconductor substrate having a P-type well, or an SOI (Silicon On Insulator) substrate having a P-type semiconductor layer, for example. Silicon (Si) is used to form the semiconductor substrate, for example.

A source region 12 and drain region 13 are formed in the substrate 11. The source region 12 and drain region 13 are formed of $n^+$-type diffusion regions formed by doping $n^+$-type impurity (phosphorus (P), arsenic (As) or the like) at a high impurity concentration into the semiconductor substrate 11. The adjacent memory cell transistors CT are serially connected by commonly using the source region 12/drain region 13.

A tunnel insulating film 14 is formed on the channel region between the source region 12 and drain region 13. As the tunnel insulating film 14, for example, a silicon oxide film is used. A floating gate electrode (FG) 15 is formed on the tunnel insulating film 14. As the floating gate electrode 15, for example, a polysilicon film is used. The floating gate electrodes 15 are selectively formed in intersecting areas between the bit lines BL and the word lines WL and provided in the memory cell transistors CT. Further, the floating gate electrodes 15 are electrically isolated from one another.

A gate-gate insulating film 16 is formed on the floating gate electrode 15. A control gate electrode (CG) 22 is formed on the gate-gate insulating film 16. As the control gate electrode 22, for example, a polysilicon film is used.

The gate-gate insulating film 16 is a laminated film having a silicon oxide film ($SiO_2$ film) 17, hafnium aluminate film ($HfAl_xO_y$ film) 18, aluminum oxide film ($AlO_x$ film) 19, hafnium aluminate film ($HfAl_xO_y$ film) 20 and silicon oxide film ($SiO_2$ film) 21 sequentially stacked. That is, the gate-gate insulating film 16 has a structure having a high-dielectric-constant film (a laminated film of the $HfAl_xO_y$ film 18, aluminum oxide film 19 and $HfAl_xO_y$ film 20) disposed between the silicon oxide films 17 and 21. The $HfAl_xO_y$ films 18, 20 are aluminum oxide films having hafnium added thereto.

In the memory cell transistor CT with the above structure, the threshold voltage of the memory cell transistor CT is changed by injecting charges stored in the floating gate electrode 15 or extracting charges stored in the floating gate electrode 15. More specifically, a bidirectional strong electric field is applied between the channel region and the control gate electrode 22 by changing the potential difference between the channel region and the control gate electrode 22 of the memory cell transistor CT. Charges are injected into the floating gate electrode 15, or charges stored in the floating gate electrode 15 are extracted by application of the bidirectional strong electric field. Thus, data of the memory cell transistor CT can be rewritten by changing the threshold voltage of the memory cell transistor CT.

The coupling ratio of the capacitor C2 between CG and FG and the capacitor C1 between FG and the substrate 11 is expressed by "C2/(C1+C2)". In a miniaturized semiconductor memory device, the facing areas of the floating gate electrode 15 and control gate electrode 22 become small. However, in order to cause the memory device to correctly function as a memory, it is necessary for the capacitor C2 between CG and FG to have a capacitance of a preset value or more.

In order to enhance the coupling ratio, it is considered to use a high-dielectric-constant film (high-k film) having a dielectric constant larger than that of a silicon oxide film as an insulating film between CG and FG. Generally, the dependency of a leak current flowing in the high-dielectric-constant film on the electric field is determined by the height of the energy barrier (barrier height) of a selected high-dielectric-constant material with respect to electrons and the dielectric constant.

Since the physical film thickness becomes larger if the dielectric constant is set large and when the effective oxide thickness (EOT) is kept constant, the leak current is reduced. In this case, the barrier height becomes smaller and the probability of electrons to tunnel through from a level higher than the Fermi level or the probability of electrons to jump over the barrier and be discharged into the insulating film becomes high. As a result, the leak current increases.

Figure 4:
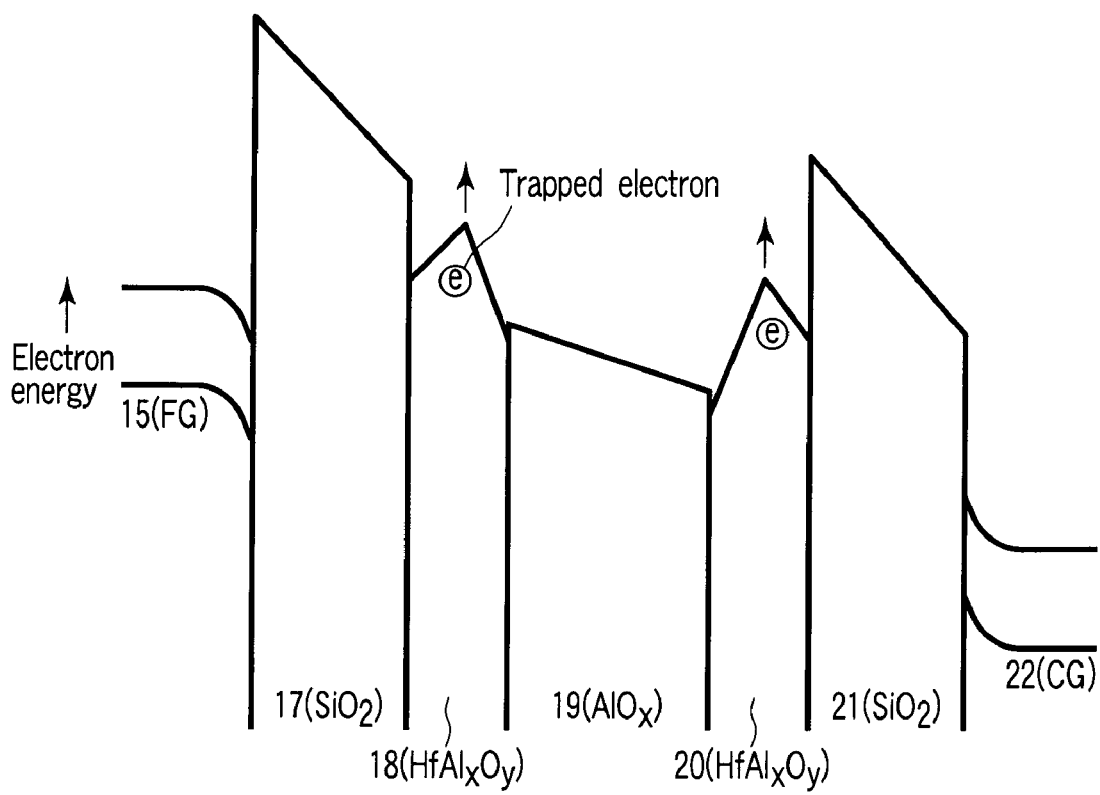
FIG. 4 is a diagram illustrating the energy level of a gate-gate insulating film 16.

The gate-gate insulating film 16 in the present embodiment has a film structure which makes it possible to effectively suppress the leak current while it has a high-dielectric-constant film to enhance the coupling ratio. FIG. 4 is a diagram illustrating the energy level of the gate-gate insulating film 16.

The silicon oxide film 17 functions as an electron barrier to prevent electrons from flowing from the floating gate electrode 15 into the high-dielectric-constant film (the laminated film of the $HfAl_xO_y$ film 18, aluminum oxide film 19 and $HfAl_xO_y$ film 20). Further, the silicon oxide film 17 functions as an electron barrier to prevent electrons from flowing from the high-dielectric-constant film into the floating gate electrode 15.

Likewise, the silicon oxide film 21 functions as an electron barrier to prevent electrons from flowing from the control gate electrode 22 into the high-dielectric-constant film (the laminated film of the $HfAl_xO_y$ film 18, aluminum oxide film 19 and $HfAl_xO_y$ film 20). Further, the silicon oxide film 21 functions as an electron barrier to prevent electrons from flowing from the high-dielectric-constant film into the control gate electrode 22.

The silicon oxide films 17, 21 each have a higher energy barrier with respect to electrons in comparison with the high-dielectric-constant film, the floating gate electrode 15 and control gate electrode 22 formed of polysilicon. Therefore, the silicon oxide films 17, 21 are respectively arranged on the interfaces of the floating gate electrode 15 and control gate electrode 22. Thus, it becomes possible to reduce a leak current from the floating gate electrode 15 to the control gate electrode 22 and a leak current from the control gate electrode 22 to the floating gate electrode 15.

The $HfAl_xO_y$ films 18, 20 have a large number of trap levels. Electrons injected into the floating gate electrode 15 are discharged from the floating gate electrode 15 by applying a weak electric field thereto. The $HfAl_xO_y$ films 18, 20 trap electrons discharged by application of the weak electric field in the trap levels. If electrons are trapped by the $HfAl_xO_y$ films 18, 20, the energy barriers of the $HfAl_xO_y$ films 18, 20 with respect to electrons become higher. As a result, the current leak occurring at the time of application of the weak electric field can be suppressed.

Electrons trapped by the $HfAl_xO_y$ films 18, 20 are discharged from the trap levels with the passage of time or by thermal excitation. When electrons are discharged from the $HfAl_xO_y$ films 18, 20, the threshold voltage of the memory cell transistor CT will be changed. This is because electrons trapped by the $HfAl_xO_y$ films 18, 20 are equivalent to electrons stored in the floating gate electrode 15 when viewing this state from the control gate electrode 22 side. Therefore, when the trapped electrons are discharged from the $HfAl_xO_y$ films 18, 20, a phenomenon equivalent to the phenomenon that electrons are reduced in the floating gate electrode 15 occurs.

In order to suppress the above influence, the absolute amount of trap levels is reduced by setting the thicknesses of the $HfAl_xO_y$ films 18, 20 to 1 nm or less. As a result, since the number of electrons trapped or discharged by the $HfAl_xO_y$ films 18, 20 is reduced, a variation in the threshold voltage of the memory cell transistor CT can be suppressed.

Further, the aluminum oxide film 19 having no hafnium (Hf) added thereto is inserted between the $HfAl_xO_y$ films 18 and 20 in order to enhance the withstand voltage by increasing the thickness of the high-dielectric-constant film and provide a film having less trap levels. Thus, the withstand voltage of the gate-gate insulating film 16 can be enhanced.

As described above in detail, according to the first embodiment, since the gate-gate insulating film 16 having the high-dielectric-constant film is used, the capacitance between CG and FG can be increased. As a result, the coupling ratio of the memory cell transistor CT can be enhanced. Further, since the coupling ratio is enhanced, the element characteristic of the memory cell transistor CT can be improved. Specifically, the data holding characteristic of the memory cell transistor CT can be improved.

Further, a leak current can be effectively suppressed by forming the electron barrier structure of the gate-gate insulating film 16.

In addition, the number of electrons trapped/discharged by the $HfAl_xO_y$ films 18 and 20 can be reduced by controlling the thicknesses of the $HfAl_xO_y$ films 18, 20. As a result, a variation in the threshold voltage of the memory cell transistor CT can be suppressed.

Further, the aluminum oxide film 19 having no hafnium (Hf) added thereto is inserted between the $HfAl_xO_y$ films 18 and 20. Thus, the withstand voltage of the gate-gate insulating film 16 can be enhanced.

Second Embodiment

In the first embodiment, since only the silicon oxide film is used as the energy barrier for the high-dielectric-constant film, the EOT becomes large. Therefore, in the second embodiment, a silicon oxide film and silicon nitride film are used in combination as the energy barrier.

Figure 5:
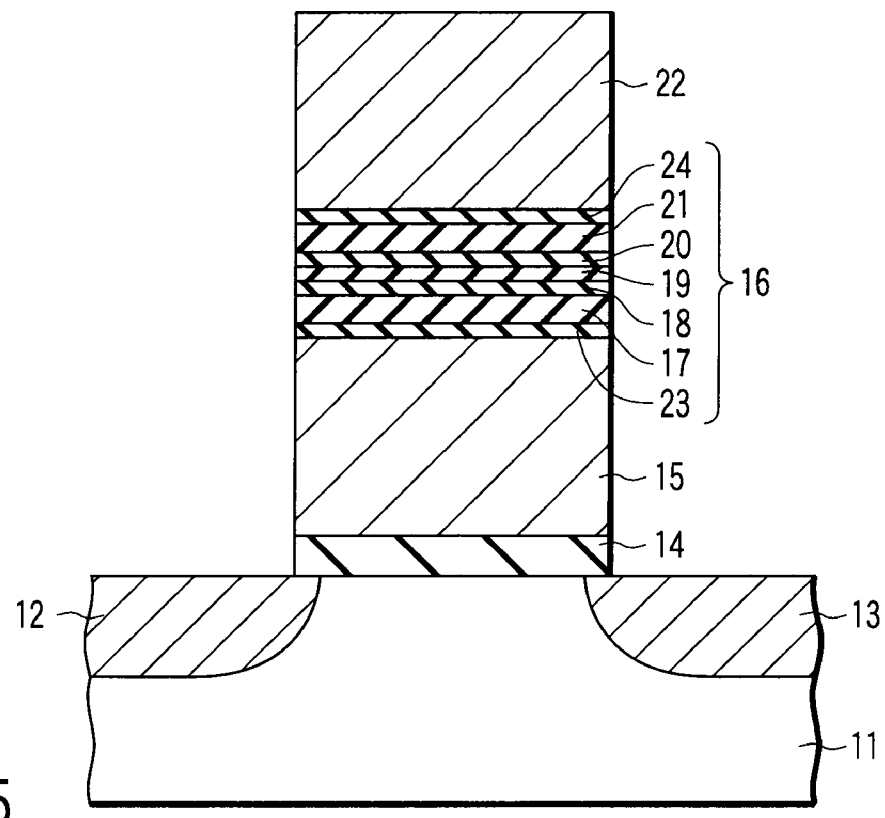
FIG. 5 is a cross sectional view illustrating a memory cell transistor CT according to a second embodiment of this invention.

FIG. 5 is a cross sectional view illustrating a memory cell transistor CT according to the second embodiment of this invention. A gate-gate insulating film 16 is a laminated film having a silicon nitride film (SiN film) 23, silicon oxide film ($SiO_2$ film) 17, hafnium aluminate film ($HfAl_xO_y$ film) 18, aluminum oxide film ($AlO_x$ film) 19, hafnium aluminate film ($HfAl_xO_y$ film) 20, silicon oxide film ($SiO_2$ film) 21 and silicon nitride film (SiN film) 24 sequentially stacked.

The silicon nitride film 23 and silicon oxide film 17 function as an electron barrier to prevent electrons from flowing from a floating gate electrode 15 into the high-dielectric-constant film (a laminated film of the $HfAl_xO_y$ film 18, aluminum oxide film 19 and $HfAl_xO_y$ film 20). Further, the silicon nitride film 23 and silicon oxide film 17 function as an electron barrier to prevent electrons from flowing from the high-dielectric-constant film into the floating gate electrode 15.

Likewise, the silicon nitride film 24 and silicon oxide film 21 function as an electron barrier to prevent electrons from flowing from a control gate electrode 22 into the high-dielectric-constant film (the laminated film of the $HfAl_xO_y$ film 18, aluminum oxide film 19 and $HfAl_xO_y$ film 20). Further, the silicon nitride film 24 and silicon oxide film 21 function as an electron barrier to prevent electrons from flowing from the high-dielectric-constant film into the control gate electrode 22.

The dielectric constant of the silicon oxide film is approximately 3.9, the dielectric constant of the silicon nitride film is approximately 7.5 and thus the dielectric constant of the silicon nitride film is approximately twice as large as that of the silicon oxide film. Therefore, the EOT of the gate-gate insulating film 16 can be reduced without reducing the coupling ratio.

If oxide films are respectively formed on the interfaces of the floating gate electrode 15 and control gate electrode 22 formed of polysilicon, the edge portions of the floating gate electrode 15 and control gate electrode 22 will be oxidized and rounded in the above manufacturing step or in a step of forming an oxide film as a protection film on the entire surface of the memory cell transistor CT. Therefore, since the facing areas of the floating gate electrode 15 and control gate electrode 22 are reduced, the capacitance between CG and FG is reduced.

In the present embodiment, since the silicon nitride films 23, 24 are respectively formed on the interfaces of the floating gate electrode 15 and control gate electrode 22, the edge portions of the floating gate electrode 15 and control gate electrode 22 can be suppressed from being oxidized and rounded. As a result, the capacitance between CG and FG can be suppressed from being reduced.

The thicknesses of the $HfAl_xO_y$ films 18, 20 are set to 1 nm or less. Therefore, a variation in the threshold voltage of the memory cell transistor CT is suppressed by reducing the absolute amount of trap levels.

In the second embodiment, the EOT can be made smaller in comparison with the first embodiment. Further, since the dielectric constant of the gate-gate insulating film 16 can be increased, the coupling ratio can be enhanced. The other effects are the same as those of the first embodiment.

Third Embodiment

In the second embodiment, since the silicon oxide film and silicon nitride film are used as the energy barrier for the high-dielectric-constant film, there is a restriction on a further reduction in the EOT. In order to reduce the EOT, it is necessary to reduce the physical thicknesses of the silicon oxide film and silicon nitride film, and therefore, there occurs a possibility that the sufficiently high withstand voltage cannot be attained. Therefore, in the third embodiment, only a silicon nitride film is used as the energy barrier, without using a silicon oxide film.

Figure 6:
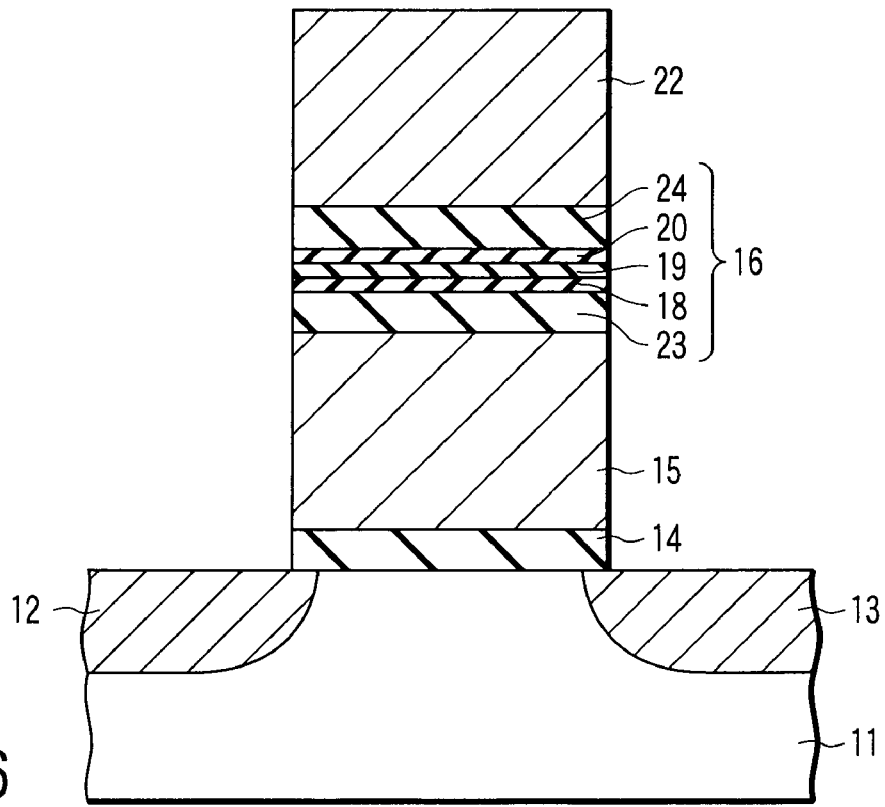
FIG. 6 is a cross sectional view illustrating a memory cell transistor CT according to a third embodiment of this invention.

FIG. 6 is a cross sectional view illustrating a memory cell transistor CT according to the third embodiment of this invention. A gate-gate insulating film 16 is a laminated film obtained by sequentially stacking a silicon nitride film (SiN) 23, hafnium aluminate film ($HfAl_xO_y$ film) 18, aluminum oxide film ($AlO_x$ film) 19, hafnium aluminate film ($HfAl_xO_y$ film) 20 and silicon nitride film (SiN) 24. That is, a high-dielectric-constant film (a laminated film of the $HfAl_xO_y$ film 18, aluminum oxide film 19 and $HfAl_xO_y$ film 20) is formed directly on the silicon nitride film 23.

The silicon nitride film 23 functions as an electron barrier to prevent electrons from flowing from a floating gate electrode 15 into the high-dielectric-constant film (the laminated film of the $HfAl_xO_y$ film 18, aluminum oxide film 19 and $HfAl_xO_y$ film 20). Further, the silicon nitride film 23 functions as an electron barrier to prevent electrons from flowing from the high-dielectric-constant film into the floating gate electrode 15.

Likewise, the silicon nitride film 24 functions as an electron barrier to prevent electrons from flowing from a control gate electrode 22 into the high-dielectric-constant film (the laminated film of the $HfAl_xO_y$ film 18, aluminum oxide film 19 and $HfAl_xO_y$ film 20). Further, the silicon nitride film 24 functions as an electron barrier to prevent electrons from flowing from the high-dielectric-constant film into the control gate electrode 22.

The silicon nitride films 23, 24 each have a higher energy barrier with respect to electrons in comparison with the high-dielectric-constant film, the floating gate electrode 15 and control gate electrode 22 formed of polysilicon. Therefore, the silicon nitride films 23, 24 are respectively formed on the interfaces of the floating gate electrode 15 and control gate electrode 22. As a result, it becomes possible to reduce a leak current from the floating gate electrode 15 into the control gate electrode 22 and a leak current from the control gate electrode 22 into the floating gate electrode 15.

The thickness of the aluminum oxide film 19 is set to 3 nm or more in order to increase the physical film thickness and enhance the withstand voltage.

When the gate-gate insulating film 16 is formed on the floating gate electrode 15, the gate-gate insulating film 16 is also formed on the side surfaces of the floating gate electrode 15. Therefore, the distance between the floating gate electrodes 15 of the adjacent two memory cell transistors CT becomes smaller due to miniaturization of the memory cell transistor CT caused by reducing the minimum processing size. If the physical film thickness of the aluminum oxide film 19 contained in the gate-gate insulating film 16 becomes excessively large, a space between the adjacent floating gates 15 is substantially filled with the gate-gate insulating film 16. As a result, there is no space in which polysilicon used to form the control gate electrode 22 is filled in between the floating gate electrodes 15. For this reason, the thickness of the aluminum oxide film 19 is set to 15 nm or less.

The thicknesses of the $HfAl_xO_y$ films 18, 20 are set to 1 nm or less. Therefore, a variation in the threshold voltage of the memory cell transistor CT is suppressed by reducing the absolute amount of trap levels.

As described above in detail, according to the third embodiment, the gate-gate insulating film 16 with a sufficiently high withstand voltage and small EOT can be formed by sole use of a silicon nitride film with a high dielectric constant as the electron barrier for the high-dielectric-constant film.

Further, the coupling ratio of the memory cell transistor CT can be enhanced since the silicon nitride film having a dielectric constant larger than that of the silicon oxide film is used. The other effects are the same as those of the first embodiment.

Fourth Embodiment

In the third embodiment, the silicon nitride film is used as the energy barrier for the high-dielectric-constant film. When polysilicon is used to form the control gate electrode 22, the work function difference thereof with respect to polysilicon becomes smaller. Therefore, in the fourth embodiment, a material having a larger work function difference with respect to the silicon nitride film is used as a conductive material of the control gate electrode 22 in order to further reduce the leak current.

Figure 7:
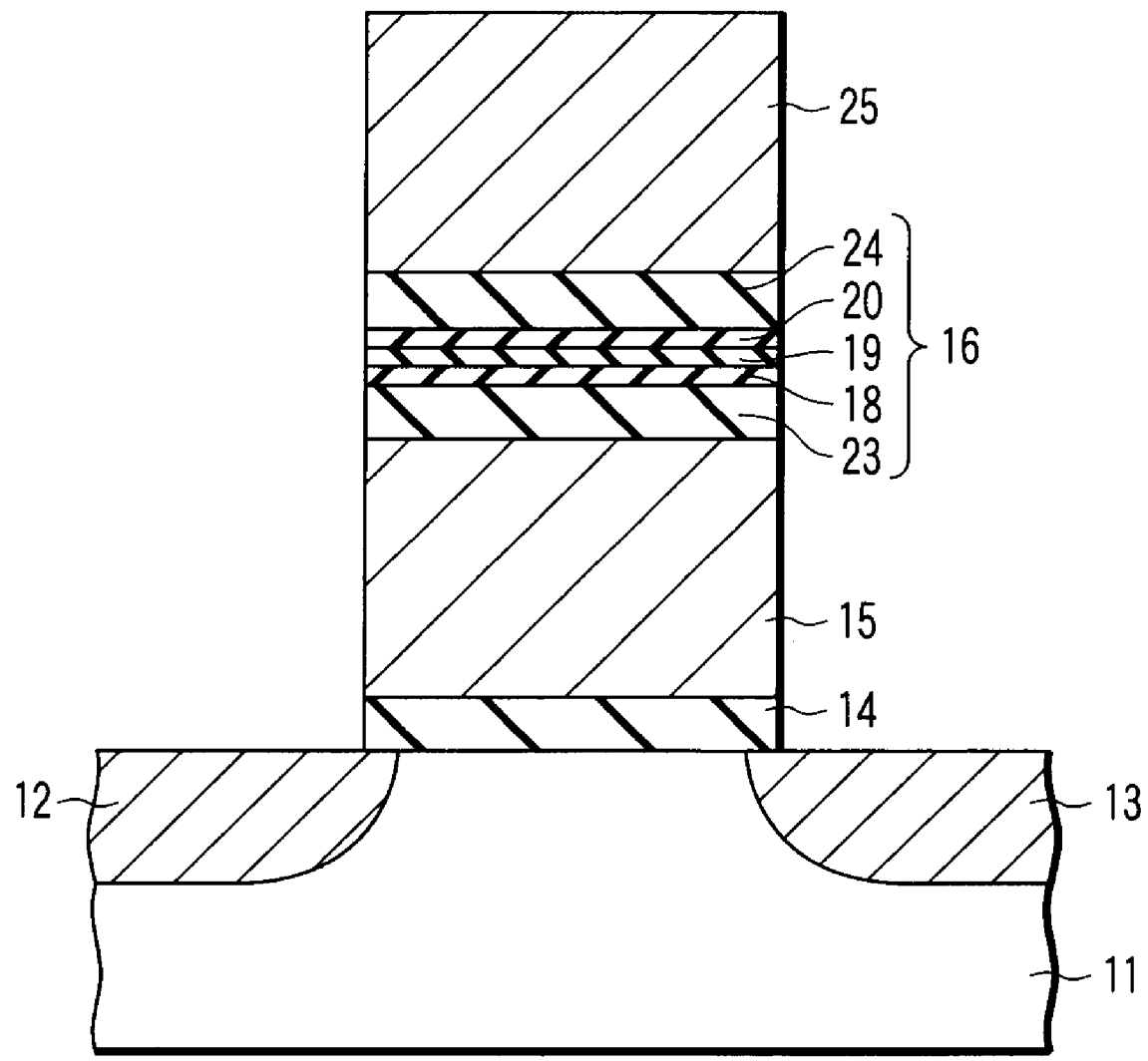
FIG. 7 is a cross sectional view illustrating a memory cell transistor CT according to a fourth embodiment of this invention.

FIG. 7 is a cross sectional view illustrating a memory cell transistor CT according to the fourth embodiment of this invention. A floating gate electrode 15 is formed on a tunnel insulating film 14. As the floating gate electrode 15, for example, a polysilicon film is used. A gate-gate insulating film 16 is formed on the floating gate electrode 15. The structure of the gate-gate insulating film 16 is the same as that in the third embodiment, for example. A control gate electrode 25 is formed on the gate-gate insulating film 16.

As the control gate electrode 25, a material having a large work function difference with respect to a silicon nitride film 24 used as an energy barrier for a high-dielectric-constant film is selected. As the work function difference is larger, the leak current can be reduced to a larger extent. As a conductive material used as the control gate electrode 25, ruthenium (Ru), ruthenium oxide ($RuO_x$), tantalum (Ta) or the like can be used.

In the memory cell transistor CT with the above structure, the work function difference between the control gate electrode 25 and the silicon nitride film 24 is large. Therefore, the energy barrier of the silicon nitride film 24 becomes higher than that of the control gate electrode 25. As a result, the leak current can be reduced.

Further, since ruthenium (Ru), ruthenium oxide ($RuO_x$), tantalum (Ta) or the like is used as the control gate electrode 25, the control gate electrode 25 can be prevented from being depleted. Thus, the current density of the control gate electrode 25 can be enhanced.

In the fourth embodiment, the gate-gate insulating film 16 used in the third embodiment is explained as one example of the gate-gate insulating film 16. However, the fourth embodiment can be applied to the first and second embodiments.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile memory element comprising:
a laminated gate provided above a semiconductor substrate with a tunnel insulating film disposed therebetween and having a floating gate electrode, a gate-gate insulating film and a control gate electrode sequentially stacked, wherein the gate-gate insulating film includes a first silicon oxide film, a first aluminum oxide film having hafnium added thereto, a second aluminum oxide film, a third aluminum oxide film having hafnium added thereto and a second silicon oxide film sequentially stacked.

2. The nonvolatile memory element according to claim 1, wherein thicknesses of the first aluminum oxide film and the third aluminum oxide film are set to be not larger than 1 nm.

3. The nonvolatile memory element according to claim 1, wherein the first aluminum oxide film and the third aluminum oxide film have trap levels.

4. The nonvolatile memory element according to claim 1, wherein
the first silicon oxide film has an energy barrier higher than that of the floating gate electrode, and
the second silicon oxide film has an energy barrier higher than that of the control gate electrode.

5. The nonvolatile memory element according to claim 1, wherein the floating gate electrode and the control gate electrode are formed of polysilicon.

6. The nonvolatile memory element according to claim 1, wherein the first silicon oxide film and the second silicon oxide film function as electron barriers.

7. The nonvolatile memory element according to claim 1, wherein the gate-gate insulating film includes a first silicon nitride film and a second silicon nitride film respectively provided on interfaces of the floating gate electrode and the control gate electrode.

8. The nonvolatile memory element according to claim 7, wherein the first silicon nitride film and the second silicon nitride film function as electron barriers.

9. A nonvolatile memory element comprising:
a laminated gate provided above a semiconductor substrate with a tunnel insulating film disposed therebetween and having a floating gate electrode, a gate-gate insulating film and a control gate electrode sequentially stacked, wherein the gate-gate insulating film includes a first silicon nitride film, a first aluminum oxide film having hafnium added thereto, a second aluminum oxide film, a third aluminum oxide film having hafnium added thereto and a second silicon nitride film sequentially stacked.

10. The nonvolatile memory element according to claim 9, wherein thicknesses of the first aluminum oxide film and the third aluminum oxide film are set to be not larger than 1 nm.

11. The nonvolatile memory element according to claim 9, wherein thickness of the second aluminum oxide film is set to be not smaller than 3 nm and not larger than 15 nm.

12. The nonvolatile memory element according to claim 9, wherein the first aluminum oxide film and the third aluminum oxide film have trap levels.

13. The nonvolatile memory element according to claim 9, wherein
the first silicon nitride film has an energy barrier higher than that of the floating gate electrode, and
the second silicon nitride film has an energy barrier higher than that of the control gate electrode.

14. The nonvolatile memory element according to claim 9, wherein the floating gate electrode and the control gate electrode are formed of polysilicon.

15. The nonvolatile memory element according to claim 9, wherein the first silicon nitride film and the second silicon nitride film function as electron barriers.

16. The nonvolatile memory element according to claim 9, wherein the control gate electrode has work function larger than that of the second silicon nitride film.

17. The nonvolatile memory element according to claim 16, wherein the control gate electrode is selected from a group consisting of ruthenium, ruthenium oxide and tantalum.

18. The nonvolatile memory element according to claim 17, wherein the floating gate electrode is formed of polysilicon.

* * * * *